US012771329B2

(12) United States Patent
Zlotnik et al.

(10) Patent No.: US 12,771,329 B2
(45) **Date of Patent: *Oct. 20, 2026**

(54) RESETTING INTEGRATED CIRCUITS

(71) Applicant: Micron Technology, Inc., Boise, ID (US)

(72) Inventors: Leon Zlotnik, Camino, CA (US); Leonid Minz, Beer Sheva (IL); Yoav Weinberg, Thornhill (CA)

(73) Assignee: Micron Technology, Inc., Boise, ID (US)

( * ) Notice: Subject to any disclaimer, the term of this patent is extended or adjusted under 35 U.S.C. 154(b) by 70 days.

This patent is subject to a terminal disclaimer.

(21) Appl. No.: 18/826,526

(22) Filed: Sep. 6, 2024

(65) Prior Publication Data

US 2024/0429904 A1 Dec. 26, 2024

Related U.S. Application Data

(63) Continuation of application No. 17/696,352, filed on Mar. 16, 2022, now Pat. No. 12,088,301.

(51) Int. Cl.

| | |
|---|---|
| ***H03K 3/037*** | (2006.01) |
| ***G11C 19/28*** | (2006.01) |
| ***H03K 3/012*** | (2006.01) |

(52) U.S. Cl.

CPC ............ *H03K 3/037* (2013.01); *G11C 19/28* (2013.01); *H03K 3/012* (2013.01)

(58) Field of Classification Search

CPC ...... H03K 3/012; H03K 3/037; H03K 3/0375; H03K 3/356; H03K 3/356008; G11C 19/28; G11C 19/287; G01R 31/318536; G01R 31/318541; G01R 31/318544

See application file for complete search history.

(56) References Cited

U.S. PATENT DOCUMENTS

| | | | | |
|---|---|---|---|---|
| 3,430,070 | A | 2/1969 | Marshall, Jr. et al. | |
| 5,179,295 | A | 1/1993 | Mattison et al. | |
| 5,767,717 | A | 6/1998 | Schorn et al. | |
| 9,599,672 | B2 | 3/2017 | Abhishek et al. | |
| 12,088,301 | B2 * | 9/2024 | Zlotnik | G11C 19/28 |
| 2004/0064770 | A1 | 4/2004 | Xin | |
| 2004/0145937 | A1 | 7/2004 | Kinoshita et al. | |
| 2006/0294282 | A1 | 12/2006 | Warner | |
| 2015/0295560 | A1 | 10/2015 | Pal et al. | |
| 2021/0239758 | A1 | 8/2021 | Deligiannis et al. | |

* cited by examiner

*Primary Examiner* — Patrick O'Neill

(74) *Attorney, Agent, or Firm* — Brooks, Cameron & Huebsch, PLLC

(57) ABSTRACT

A plurality of flip-flops of an integrated circuit (IC) (e.g., an ASIC) are electrically connected in a predefined series. The scan input gate of any give flip-flop in the predefined series is electrically connected to one of a Q output gate or a Q-bar output gate of an adjacent flip-flop in the predefined series. A reset operation for the IC occurs by feeding a bit string of identical bits (e.g., all zeros) through the scan input gate of a first flip-flop of the plurality of flip-flops to reset the plurality of flip-flops without the need for resetting circuitry and accompanying power savings for the IC.

17 Claims, 3 Drawing Sheets

RESETTING INTEGRATED CIRCUITS

PRIORITY INFORMATION

This application is a Continuation of U.S. application Ser. No. 17/696,352, filed on Mar. 16, 2022, which issues as U.S. Pat. No. 12,088,301 on Sep. 10, 2024, the contents of which are incorporated herein by reference.

TECHNICAL FIELD

Embodiments of the disclosure relate generally to integrated circuits, and more specifically, relate to resetting of integrated circuits.

BACKGROUND

An integrated circuit can include one or more digital circuits that can include resetting circuitry. In general, the resetting circuitry occupies a lot of area while having high power requirements.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to resetting integrated circuits. Traditionally, resetting integrated circuits has been achieved using reset circuitry, which occupies a substantial area on the integrated circuit in addition to requiring a substantial amount of power to maintain and operate when occasionally needed. Aspects of the present disclosure, in contrast, do not include such reset circuitry in the integrated circuits. Accordingly, resetting integrated circuits according to aspects of the present disclosure can provide benefits in systems (e.g., application-specific integrated circuits (ASICs), field-programmable gate arrays (FPGAs), automated power management systems, etc.) that require resetting. Examples of resetting integrated circuits and the circuitries that can be utilized to facilitate embodiments of the present disclosure are described below in conjunction with FIG. 1, et alibi.

Some approaches to resetting integrated circuits include specialized circuitry to perform a reset of flip-flops in the integrated circuit. For example, some approaches rely on each flip-flop in the integrated circuit having an asynchronous reset or each flip-flop in the integrated circuit having a synchronous reset. In general, these resets are activated using a reset network. Traditional reset networks generally include a high fanout network where one cell (e.g., a synchronizer) drives all (or most) of the flip-flops during performance of a reset operation. However, such reset networks are generally large in terms of real estate on chip (e.g., on an application-specific integrated circuit in which the flip-flops are deployed) and generally consume on the order of 15% of the power consumed by the integrated circuit. Further, in such approaches, the flip-flops can be controlled to toggle simultaneously (or near-simultaneously) during performance of a reset operation, which can induce a current spike in the integrated circuit.

In addition, conventional approaches to resetting flip-flops in an integrated circuit (particularly when performing an asynchronous reset) can generate reset domain crossing (RDC) issues that may be difficult to debug. In general, a RDC occurs when a transmitting flop of a path has an asynchronous reset and the receiving flop has an uncorrelated reset of no reset at all. RDC issues can include metastability, glitches, and/or loss of functional correlation in at least a portion of the integrated circuit, among other undesirable effects.

Figure 1:
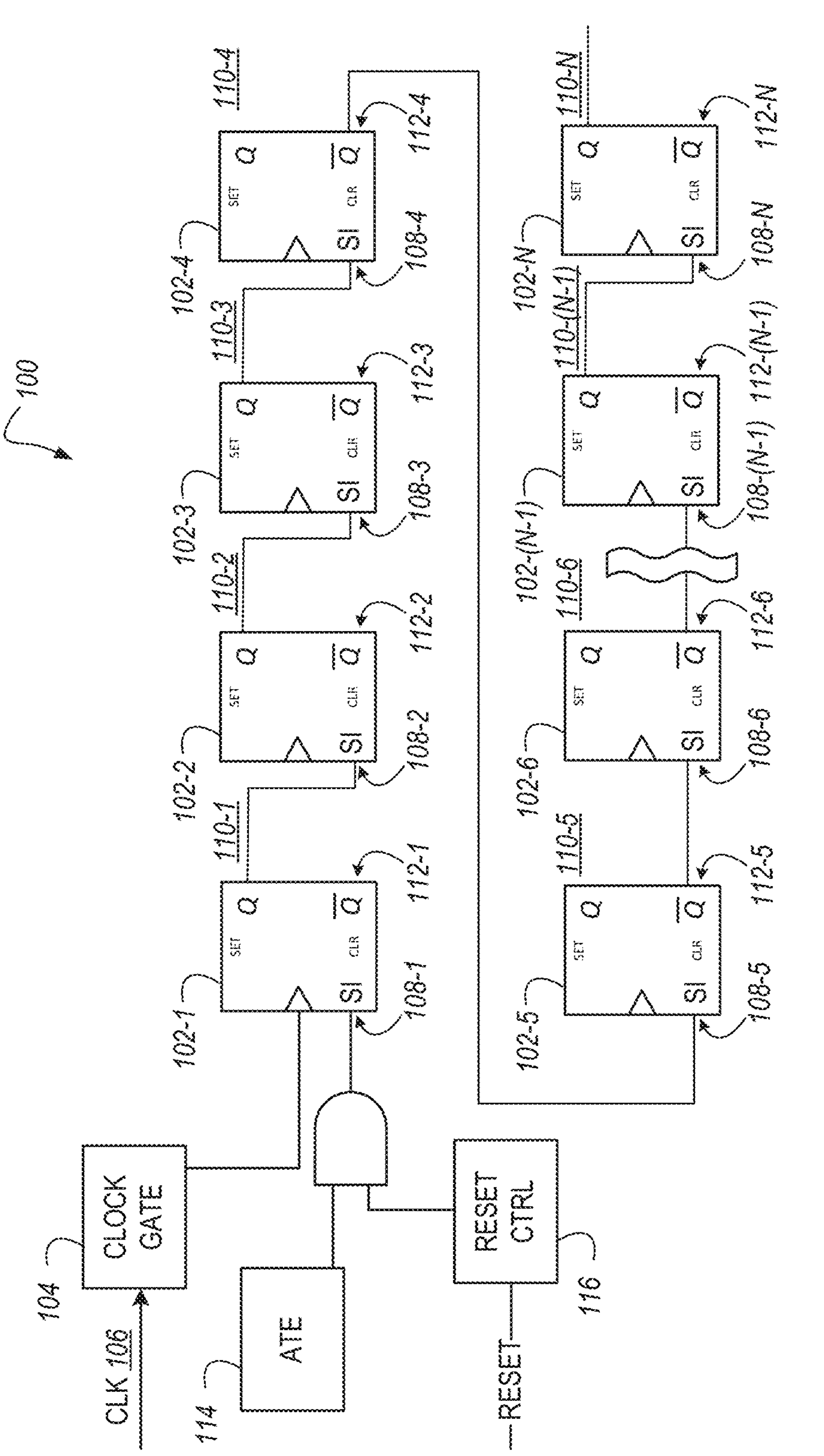
FIG. 1 illustrates an example apparatus for resetting an integrated circuit in accordance with some embodiments of the present disclosure.
Figure 2:
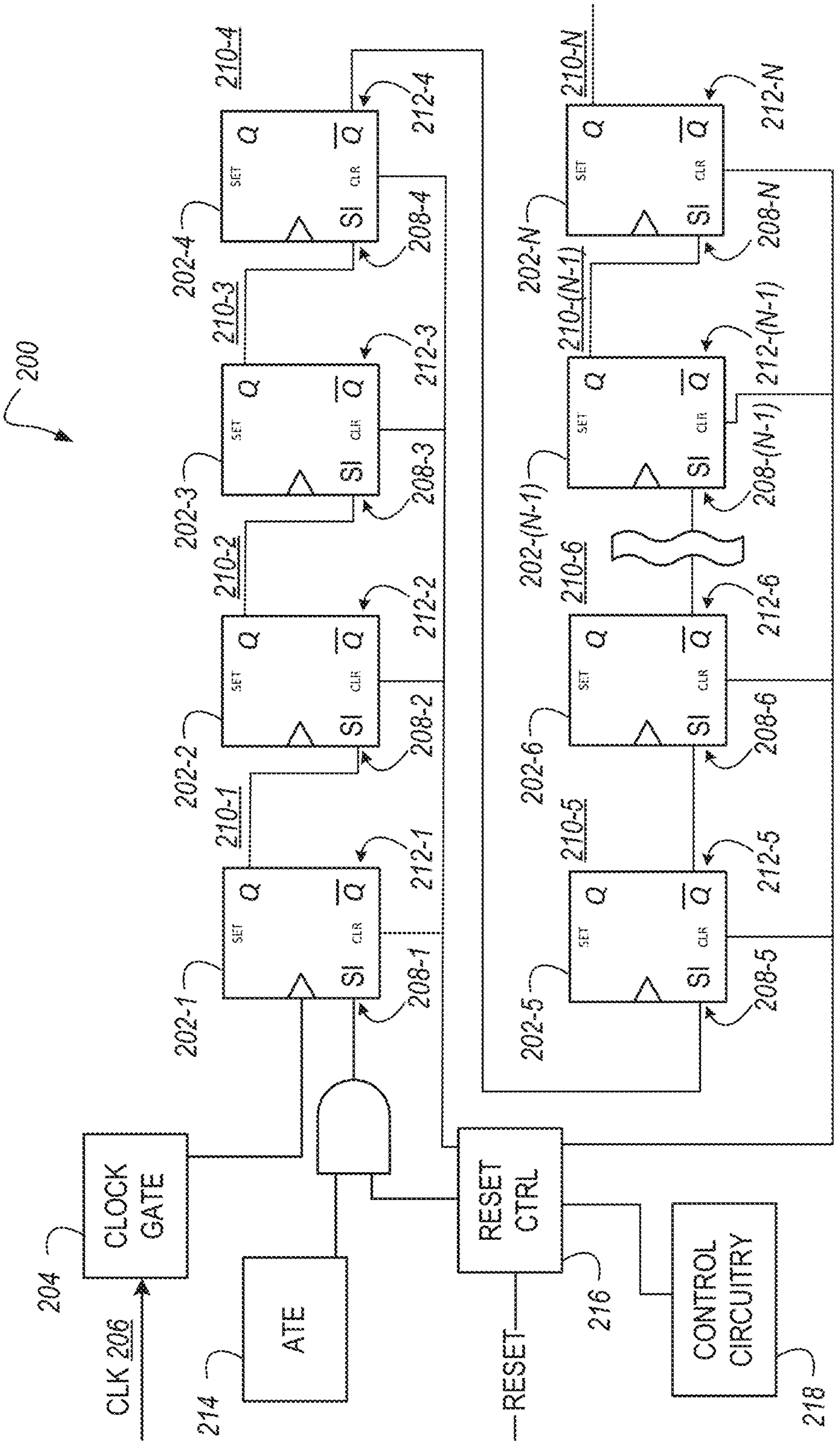
FIG. 2 illustrates another example apparatus for resetting an integrated circuit in accordance with some embodiments of the present disclosure.

To address these and other deficiencies inherent in previous approaches, aspects of the present disclosure are directed to an integrated circuit with flip-flops electrically connected in a predefined series. In this predefined series, each flip-flop includes a scan input (SI as seen in FIG. 1 and FIG. 2) gate, a Q output gate and a Q-bar output gate, but do not include a reset gate or the associated reset circuitry. By removing the reset gate and/or associated circuitry, an amount of area dedicated to the circuits described herein can be reduced by at least 10%, while the amount of power consumed in operation of such circuits can also be reduced by at least 10%. In addition, some embodiments herein allow for the existing scan structure to be maintained while removing the reset gate and/or the associated circuitry, thereby allowing for a fairly straightforward implementation of the disclosure.

As described in more detail herein, the predefined series of flip-flops of the present disclosure are electrically connected in series by one of either the Q output gate or the Q-bar output gate to the scan input gate of an adjacent flip-flop in the predefined series. The predefined series of flip-flops is used with at least a portion of the scan circuitry present in the integrated circuit to reset the integrated circuit.

Further, embodiments of the present disclosure can reduce the amount of power consumed by a system (e.g., an ASIC or SoC, or other such computing system) by one or more of the following: (a) a reduction in physical area resulting from removal of conventional reset networks that involve dedicated communication paths and/or circuitry to reset a plurality of flip-flops, (b) a reduction in static (e.g., leakage) power or current that is associated with conventional reset networks, (c) a reduction in dynamic (e.g., routing) power as a result of less area being consumed with communication paths and/or circuitry that are prevalent in conventional reset networks, and/or (d) fewer flip-flops may be utilized to perform the operations herein, thereby leading to a reduction in a static (e.g., leakage) power associated with each flip-flop.

Unlike the scan test used in the scan circuitry, however, the embodiments of the present disclosure feed a bit string, or reset chain, of identical bits (e.g., all zeros or all ones) through the scan input gate of a first flip-flop of the plurality of flip-flops to reset the plurality of flip-flops. In other words, the scan gate of the first flip-flop in the predefined series of flip-flops receives the bit string, or reset chain, of entirely identical bits during (or instead of) the reset of the integrated circuit as provided herein. The first flip-flop in the plurality of flip-flops (and subsequent flip-flops in the predefined series) outputs a predefined bit from either the Q output gate or the Q-bar output gate of the respective flip-flop, which is subsequently fed to the scan input gate of the subsequent flip-flop. As a result, electrically connecting the plurality of flip-flops in the predefined series produces a scan out chain of bits from either the Q output gate or the Q-bar output gate of a final flip-flop in the predefined series that is different from the identical bits of the bit string, or reset chain. The resulting scan out chain can then be compared to an expected response data stored in memory, where a match of the scan out chain with the expected response data indicates a reset of the integrated circuit. These and other aspects of the present disclosure can provide for a reduction in power consumption in various types of systems, computing devices, and/or circuits; thereby providing an improvement to computing devices in which aspects of the present disclosure are deployed.

It is noted that, although embodiments described herein generally focus on an integrated circuit that does not include a reset gate or the associated reset circuitry, embodiments are not so limited, and integrated circuits that include a reset gate and/or the associated reset circuitry are contemplated within the scope of the disclosure. For example, embodiments are contemplated herein in which the integrated circuit is provided with the ability to feed a bit string, or reset chain, of identical bits (e.g., all zeros or all ones) through the scan input gate of a first flip-flop of the plurality of flip-flops to reset the plurality of flip-flops or to utilize conventional reset gates and/or reset circuitry to perform an operation to reset the flip-flops depending on the situation.

FIG. 1 illustrates an example apparatus 100 for resetting an integrated circuit in accordance with some embodiments of the present disclosure. The example apparatus 100, which can be referred to in the alternative as a "system 100," includes a plurality of flip-flops 102-1, 102-2, 102-3, to 102-N, which are referred to in the alternative as "latches" 102-1, 102-2, 102-3, to 102-N (which are generally referred to as the "the plurality of flip-flops 102-1 to 102-N" or "the plurality of latches 102-1 to 102-N," herein). As shown in FIG. 1, the apparatus 100 further includes a clock gate 104. The clock gate 104 can receive a clock signal "CLK 106" from circuitry external to the apparatus 100 illustrated in FIG. 1.

As shown in FIG. 1, the clock gate 104 is coupled to the flip-flops 102-1 to 102-N. Among other things, the clock gate 104 can provide for reduced power dissipation and power savings in disabling portions of the circuitry so that the flip-flops in them do not have to switch states and only generates logic transitions when it is actively computing (e.g., clock gating logic coded into the register-transfer level). For example, the signal pins labeled "CLR" in FIG. 1 are not coupled to signal lines that can apply signaling indicative of a "conventional" reset operation. This can allow for signaling indicative of a "conventional" reset operation to not be received by the flip-flops 102-1 to 102-N, which can reduce a quantity of electrical and/or circuit components within the apparatus 100 and/or an amount of power consumed in performing reset operations using the apparatus 100. In some embodiments, a clock signal (i.e., the CLK 106) is asserted to the clock gate 104 to initiate the clock gating logic. In general, the "flip-flops" referred to herein are edge-triggered flip-flops (e.g., flip-flops that are edge-triggered devices that response to a rising or falling edge of a clocking signal) or level-sensitive flip-flops (e.g., flip-flops that are level-triggered devices that are transparent for a particular clock signal level and opaque for a different clock signal level).

Each flip-flop in the plurality of flip-flops 102-1 to 102-N has a scan input gate 108-1 to 108-N, a Q output gate 110-1 to 110-N, and a Q-bar output gate 112-1 to 112-N. As discussed herein, the bit string according to the present disclosure enters the apparatus 100 at a first of the flip-flops 102-1 at the scan input gate 108-1. The resulting output of flip-flop 102-1, in this case from the Q output gate 110-1, is directly connected to the scan input gate 108-2 of a second of the flip-flops 102-2, where for this example directly connecting either the Q output gate 110-2 to 110-N, or the Q-bar output gate 112-2 to 112-N to the scan input gate 108-3 to 108-N is repeated for the entire predetermined series of sequential flip-flops 102-1 to 102-N. So, for a given set value entering a scan input gate 108-1 to 108-N, either the respective Q output gate 110-1 to 110-N provides for the normal value output or the Q-bar output gate 112-1 to 112-N provides for the complement value of the set value. That is, if a particular flip-flop 102-1 to 102-N receives a logical "0" value, the Q output gate 110-1 to 110-N outputs a logical "0" value while the Q-bar output gate 112-1 to 112-N outputs a logical (1) value. It is also envisioned that the Q-bar circuitry used in forming any of the Q-bar output gates 112-1 to 112-N may be branched from Q with separate invertor.

The apparatus 100 further includes automated testing equipment (ATE) 114, which provides for diagnostic and health characteristics testing of the apparatus 100. As used herein, "automated testing equipment" refers to an apparatus that performs tests (e.g., diagnostic tests) on a device under test, equipment under test, or a unit under test using automation to perform measurements (e.g., perform diagnostic tests) and evaluate the results of the measurements. In some approaches, ATE 114 may be used to determine one or more faulty components of a device under test.

As used herein, "health characteristics" refer to various parameters and/or statuses associated with a device under test that may vary over time. For example, some health characteristics, such as a number of uncorrectable errors associated with a memory device and/or a number of program/erase cycles associated with the memory device, may increase over time leading to degradation of a memory device coupled to the apparatus 100. Some other health characteristics such as status checks of cards (e.g., memory devices, chips, or other circuitries) and/or status checks of registers (e.g., data structures storing memory addresses and/or memory locations associated with data retrieval and storage of data in a memory device) may change over time based on varying conditions and/or implementations.

The apparatus 100 further includes a reset controller 116, which is coupled with the ATE 114 and is configured to perform operations that can cause the resetting of the plurality of flip-flops 102-1 to 102-N in apparatus 100. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The components of the apparatus 100, such as the plurality of flip-flops 102-1 to 102-N, the clock gate 104, the ATE 114, and/or the reset controller 116 can individually or collectively be referred to herein as a "system" or an "apparatus," given the context of the disclosure. Accordingly, one or more components of the apparatus 100 (e.g., the plurality of flip-flops 102-1 to 102-N, the clock gate 104, the ATE 114, and/or the reset controller 116) can be provided on a single chip and/or a portion thereof. Similarly, one or more components of the apparatus 100 (e.g., the plurality of flip-flops 102-1 to 102-N, the clock gate 104, the ATE 114, and/or the reset controller 116) can be provided on multiple chips and/or portions thereof.

The apparatus 100 can include at least a portion of a system-on-chip (SoC), such as an application-specific integrated circuit (ASIC), field-programmable gate array (FPGA), etc. For example, the plurality of flip-flops 102-1 to 102-N, the clock gate 104, the ATE 114, and/or the reset controller 116 can be resident on a SoC, such as an ASIC, FPGA, or the like. As used herein, the term "resident on" refers to something that is physically located on a particular component. For example, the plurality of flip-flops 102-1 to 102-N, the clock gate 104, the ATE 114, and/or the reset controller 116 being "resident on" the apparatus 100 (e.g., an ASIC, FPGA, etc.) refers to a condition in which the hardware circuitry that comprises the plurality of flip-flops 102-1 to 102-N, the clock gate 104, the ATE 114, and/or the reset controller 116 is physically located on the apparatus 100. The term "resident on" may be used interchangeably with other terms such as "deployed on" or "located on," herein.

As described herein, the plurality of flip-flops 102-1 to 102-N are electrically connected in series to provide a predetermined series of sequential flops. As used herein, a "predetermined series" of sequential flip-flops provide flip-flops that occur in and are electrically connected in series (e.g., coming one after another) along a single electrical path. In addition, the predetermined series of sequential flip-flops in which one of either the Q output gate or the Q-bar output gate is electrically connected to the scan input gates of the adjacent flip-flop in the plurality of flip-flops 102-1 to 102-N can provide a preset physical digital logic path for the apparatus 100.

As illustrated in FIG. 1, a first flip-flop 102-1 starts the predefined series of sequential flip-flops in which each of the plurality of flip-flops 102-1 to 102-N in the predefined series is electrically connected (in series) to a single adjacent flip-flop (e.g., flip-flop 102-2) in the predefined series through one of the Q output gate or the Q-bar output gate. In other words, in some embodiments, electrical connections for the predefined series of flip-flops 102-1 to 102-N are made only through one of either a Q output gate or a Q-bar output gate of the flip-flops in the series of flip-flops to the scan input gate of an adjacent flip-flop in the series of flip-flops.

For example, electrical connections between the Q output gate and the scan input gate of a plurality of flip-flops 102-1 to 102-N in a predefined series are illustrated in FIG. 1 as follows. As seen in FIG. 1, the first flip flop 102-1 includes the scan input gate 108-1, the Q output gate 110-1 and the Q-bar output gate 112-1. The first flip-flop 102-1 is electrically connected in series to a second flip-flop 102-2, where the electrical connection is made between the Q output gate 110-1 of the first flip-flop 102-1 and the scan input gate 108-2 of the second flip-flop 102-2. Similarly, the second flip flop 102-2 is electrically connected in series to the third flip-flop 102-3 with the electrical connection being between the Q output gate 110-2 of the second flip-flop 102-2 and the scan input gate 108-3 of the third flip flop 102-3. Such electrical connections just described above repeat themselves for the series electrical connection between the third flip-flop 102-3 and the fourth flip-flop 102-4; and flip-flop 102-N−1 and the final flip-flop 102-N in the predefined series of flip-flops. For the various embodiments, flip-flops electrically connected in this way (e.g., between the Q output gate and the scan input gate) can be referred to as a first series of flip-flops, in which electrically connecting in series each of the first series of flip-flops to an adjacent flip-flop in the first series is between the Q output gate and the scan input gate.

Similarly, electrical connections between the Q-bar output gate and the scan input gate are illustrated between the fourth flip-flop 102-4 and the fifth flip-flop 102-5; the fifth flip-flop 102-5 and the sixth flip-flop 102-6; and the sixth flip-flop 102-6 and the seventh flip-flop 102-7 (not shown). For the various embodiments, flip-flops electrically connected in this way (e.g., between the Q-bar output gate and the scan input gate) can be referred to as a second series of flip-flops, in which electrically connecting in series each of the second series of flip-flops to an adjacent flip-flop in the first series is between the Q-bar output gate and the scan input gate. For the various embodiments, the predefined series of the plurality of flip-flops 102-1 to 102-N can include different numbers of the first series of flip-flops and of the second series of flip-flops, where each of the different number of series (e.g., the first series or the second series) themselves have different numbers of serially connected flip-flops.

FIG. 1 also illustrates the fact that each flip-flop 102 of the plurality of flip-flops plurality of flip-flops 102-1 to 102-N does not include a reset input or a set input and instead includes a scan input (SI) gate 108. In addition, the apparatus 100 does not include reset circuitry, such as circuitry that is configured to apply signaling to each of the flip-flops 102-1 to 102-N to perform a rest operation involving the plurality of flip-flops 102-1 to 102-N. By removing the reset gate and/or associated circuitry, an amount of area dedicated to the circuits described herein can be reduced by at least 10%, while the amount of power consumed in operation of such circuits can also be reduced by at least 10%. In addition, some embodiments herein allow for the existing scan structure to be maintained while removing the reset gate and/or the associated circuitry, thereby allowing implementation of the disclosure.

The reset controller 116 of the present disclosure performs operations that can cause the resetting of the plurality of flip-flops 102-1 to 102-N in apparatus 100. The approach to accomplishing this resetting of the plurality of flip-flops 102-1 to 102-N differs from the traditional approach because of the apparatus 100 having no reset circuitry. Specifically, in resetting the flip-flops 102-1 to 102-N in apparatus 100 the reset controller 116 provides circuitry that is configured to provide a bit string, also referred to herein as a reset chain, of identical bits that is received at the scan input gate of the first flip-flop 102-1 of the plurality of flip-flops 102-1 to 102-N for the resetting of the apparatus 100.

For the various embodiments, the bit string of identical bits can be all zeros. Alternatively, for the various embodiments the bit string of identical bits can be all ones. In other words, the bit string of the present disclosure may or may not include or include a combination of zeros and ones. However, in at least one embodiment, the bit string of the present disclosure does not include a combination of ones or zeros (e.g., the bit string contains entirely identical bits, such as all ones or all zeros). In addition, a quantity of the identical bits in the bit string can be equal to or larger than the number of flip-flops 102 in the plurality of flip-flops 102-1 to 102-N. For example, the quantity of the identical bits in the bit string is larger than the number of flip-flops 102 in the plurality of flip-flops 102-1 to 102-N.

To reset the plurality of flip-flops 102-1 to 102-N, the embodiments of the present disclosure feed the bit string, or reset chain, of identical bits (e.g., all zeros or all ones) through the scan input gate of the first flip-flop 102-1 of the plurality of flip-flops 102-1 to 102-N. In other words, the scan gate of the first flip-flop 102-1 in the predefined series of flip-flops 102-1 to 102-N receives the bit string of identical bits during the reset of the integrated circuit. In response, the first flip flop 102-1 in the plurality of flip-flops 102-1 to 102-N in the predefined series outputs a predefined bit from, in the case illustrated in FIG. 1, the Q output gate. The predefined bit from the Q output gate will be identical to the bit of the bit string entering the scan input gate of the first flip-flop 102-1. In the same fashion, flip-flops in the first series of flip-flops, as discussed herein, will each provide a predefined bit from the Q output gate that is identical to the bit entering the scan input gate of the respective flip-flop. Similarly, flip-flops in the second series of flip-flops, as discussed herein, will each provide a predefined bit from the Q-bar output gate that is inverted with respect to the bit entering the scan input gate of the respective flip-flop. Given that there will be a plurality of each of the first series and the second series, where each includes a plurality of flip-flops, the scan out chain of bits produced from either the Q output gate or the Q-bar output gate of the final flip-flop 102-N in the predefined series will be different than the identical bits of the bit string. The resulting scan out chain can then be compared to an expected response data stored in memory, where a match of the scan out chain with the expected response data indicates a reset of the integrated circuit.

In some embodiments, the apparatus 100 can be deployed on, or otherwise included in a memory system (e.g., a storage device, a memory module, or a hybrid of a storage device and memory module). Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

In other embodiments, the apparatus 100 can be deployed on, or otherwise included in a computing device such as a desktop computer, laptop computer, server, network server, mobile computing device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

Such computing devices can include a host system that is coupled to a memory system (e.g., one or more storage devices, memory modules, or a hybrid of a storage device and memory module). A host system can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system uses the storage device, the memory module, or a hybrid of the storage device and the memory module, for example, to write data to the storage device, the memory module, or the hybrid of a storage device and memory module and read data from the storage device, the memory module, or the hybrid of a storage device and memory module.

In these examples, the host system can include a processing unit such as a central processing unit (CPU) that is configured to execute an operating system. In some embodiments, the processing unit can execute a complex instruction set computer architecture, such an x86 or other architecture suitable for use as a CPU for a host system.

A host system can be coupled to a memory system via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system and the memory system. The host system can further utilize an NVM Express (NVMe) interface to access components when the memory system is coupled with the host system by the PCIe interface. The physical host interface can provide an interface for passing control, address, data, and other signals between the memory system and the host system. In general, the host system can access multiple memory sub-systems via a same communication connection, multiple separate communication connections, and/or a combination of communication connections.

A memory system can include any combination of the different types of non-volatile memory devices and/or volatile memory devices. The volatile memory devices can be, but are not limited to, random access memory (RAM), such as dynamic random-access memory (DRAM) and synchronous dynamic random access memory (SDRAM).

Some examples of non-volatile memory devices include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory components such as three-dimensional cross-point arrays of non-volatile memory cells and NAND type memory (e.g., 2D NAND, 3D NAND) are described, the memory device can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory system can also include additional circuitry or components. In some embodiments, a memory system can include a cache or buffer (e.g., DRAM) and address circuitry (e.g., a row decoder and a column decoder) that can receive an address from the memory system controller and decode the address to access the memory device(s).

In some embodiments, memory devices can include local media controllers that operate in conjunction with a memory system controller to execute operations on one or more memory cells of the memory devices. For example, an external controller can externally manage the memory device (e.g., perform media management operations on the memory device). In some embodiments, a memory device is a managed memory device, which is a raw memory device combined with a local controller for media management within the same memory device package. An example of a managed memory device is a managed NAND (MNAND) device.

FIG. 2 illustrates another example apparatus 200 for resetting of an integrated circuit in accordance with some embodiments of the present disclosure. The apparatus 200 can be analogous to the apparatus 100 described in connection with FIG. 1, herein. Accordingly, each of the components of the apparatus 200 can be analogous to their corresponding counterparts illustrated in FIG. 2. However, as shown in FIG. 2, the apparatus 200 further includes reset signaling paths that are coupled to reset pins of the flip-flops 202-1 to 202-N (e.g., "CLR" terminals of the flip-flops) that can carry signals indicative of a conventional reset operation (e.g., an asynchronous reset operation) to each of the flip-flops 202-1 to 202-N, as described above. It is appreciated that the reset signaling path can, alternatively, be coupled to the SET input terminal, instead of the CLR terminal, of a given flip-flop 202-1 to 202-N. Although the flip-flops 202-1 to 202-N shown in FIG. 2 include CLR terminals and SET terminals, it will be appreciated that some or all of the flip-flops 202-1 to 202-N may not include CLR terminals and/or SET terminals. Accordingly, the apparatus 200 can include different combinations of flip-flops 202-1 to 202-N that include CLR and/or SET terminals and flip-flops 202-1 to 202-N that do not include CLR and/or SET terminals.

In addition, the embodiments illustrated in FIG. 2 further include control circuitry 218 coupled to the reset controller 216. In some embodiments, the control circuitry 218 can include hardware circuitry (e.g., logic, etc.) that can be configured to determine whether to perform a reset operation involving applying signaling to the reset pins of the flip-flops 202-1 to 202-N (e.g., a "conventional" reset operation) and/or to cause a bit string, or reset chain, of identical bits (e.g., all zeros or all ones, or a combination of ones and zeros) to be passed through the scan input gate of a first flip-flop of the plurality of flip-flops 202-1 to 202-N to reset the plurality of flip-flops 202-1 to 202-N, as described in connection with FIG. 1, herein.

For example, under certain conditions (e.g., based on workloads, application performance, tasks, functions, etc.) of a computing system in which the apparatus 200 is deployed, it may be beneficial to selectively perform a conventional reset operation while maintain the ability to perform the reset operations described herein in which the bit string or reset chain comprising identical bits is passed through the plurality of flip-flops 202-1 to 202-N. In such scenarios, the embodiments illustrated in FIG. 2 can, utilizing the control circuitry 218, selectively determine which type of reset (e.g., "conventional" versus application of a bit string or reset chain comprising identical bits) is applied to the apparatus 200. Although inclusion of the control circuitry 218 in the apparatus (and corresponding reset signaling paths) may fail to reduce the amount of space (e.g., the footprint) of the apparatus 200 in comparison to previous approaches, the flexibility of selectively providing the option to perform a "conventional" reset operation (e.g., via the CLR terminals) or a reset operation in which application of a bit string or reset chain comprising identical bits can reduce an amount of power consumed by the apparatus 200 and, hence an amount of power consumed in a computing system in which the apparatus 200 is deployed.

Flip-Flops 202 that may experience a chained reset and flip-flops 202 that may experience an asynchronous "CLR" reset signaling may be from different sets of flip-flops 202. The sets of flip-flops 202 that can be reset in a chained manner and the sets of flip-flops 202 that can be asynchronously reset (e.g., by application of a reset signal to the "CLR" pin of the flip-flop 202) can be overlapping (e.g., some flip-flops 202 can be asynchronously reset and can be reset by application of signaling to the CLR pin) or non-overlapping (e.g., some flip-flops 202 can be asynchronously reset or can be reset by application of signaling to the CLR pin). In other words, not all flip flops 202 having a reset chain may have "CLR" connections and vice versa and, not all flip-flops having "CLR" may be chained.

Figure 3:
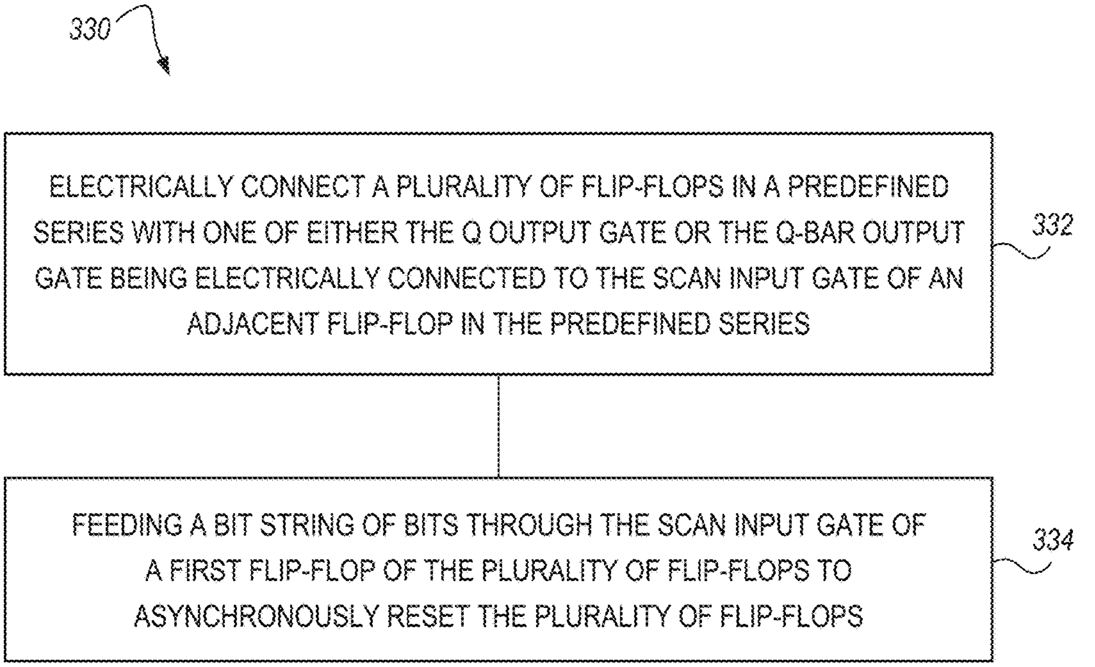
FIG. 3 is a flow diagram corresponding to a method for resetting integrated circuits in accordance with some embodiments of the present disclosure.

FIG. 3 is a flow diagram corresponding to a method 330 for resetting integrated circuits in accordance with some embodiments of the present disclosure. For example, the method 330 can be a method 330 for resetting the plurality of flip-flops to reduce an amount of power consumed in systems (e.g., ASICS, SoCs, etc.) in performing various operations such as a reset operation in accordance with some embodiments of the present disclosure. As described above, the amount of power can be reduced by one or more of the following (a) a reduction in physical area resulting from removal of conventional reset networks that involve dedicated communication paths and/or circuitry to reset a plurality of flip-flops, (b) a reduction in static (e.g., leakage) power or current that is associated with conventional reset networks, (c) a reduction in dynamic (e.g., routing) power as a result of less area being consumed with communication paths and/or circuitry that are prevalent in conventional reset networks, and/or (d) fewer flip-flops may be utilized to perform the operations herein, thereby leading to a reduction in a static (e.g., leakage) power associated with each flip-flop.

The method 330 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 330 is performed by one or more components of the apparatus 100 of FIG. 1 and/or the apparatus 200 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 332, an operation to electrically connect the plurality of flip-flops, as illustrated in FIG. 1 and FIG. 2, in the predefined series can be performed, whereas discussed herein only one of the Q output gate or the Q-bar output gate of each of the flip-flops in the predefined series is electrically connected to the scan input gate of an adjacent flip-flop. As described above, the flip-flops can be edge-triggered devices and/or level-triggered devices. The plurality of flip-flops in the predefined series can be electrically connected in a plurality of the first series and second series of flip-flops described in connection with FIG. 1 and FIG. 2, herein.

For example, in some embodiments, electrically connecting the plurality of flip-flops in the predefined series includes electrically connecting in series each of a first series of flip-flops to an adjacent flip-flop in the first series between the Q output gate and the scan input gate. Similarly, in some embodiments, electrically connecting the plurality of flip-flops in the predefined series includes electrically connecting in series each of a second series of flip-flops to an adjacent flip-flop in the second series between the Q-bar output gate and the scan input gate.

It is noted that the terms "first series" and "second series" merely refer to subsets of flip-flops that are connected either by a Q output of a preceding flip-flop in the series or by a Q bar output gate of the preceding flip-flop in the series. Accordingly, a "first series" of flip-flops" may be coupled to a "second series" of flip-flops, which may be coupled to a "first series" of flip-flops, etc. Further, different "first series" or "second series" of flip-flops may not contain the same quantity of flip-flops. For example, a first series of flip-flops comprising ten flip-flops may be coupled to a second series of flip-flops comprising eight flip-flops. The second series of flip-flops may be coupled to a first series of "flip-flops comprising fifteen flip-flops. The first series of flip-flops comprising fifteen flip-flops can be coupled to another second series of flip-flops comprising four flip-flops, etc. Stated alternatively, the terms "first series" and "second series" are not intended to refer to grouping or subsets of flip-flops that are identical or contain an identical quantity of flip-flops but rather are intended to describe the physical electrical coupling of the flip-flops (e.g., between Q output gates or Q bar output gates).

At operation 334, the bit string comprising identical bits is fed through the scan input gate of the first flip-flop of the plurality of flip-flops to reset the plurality of flip-flops, as described in connection with FIG. 1 and FIG. 2. As discussed herein, this helps to reduce the amount of power consumed in performing a reset operation on the plurality of flip-flops described in connection with operation 332. The reset operation can be analogous to the reset operation described in connection with FIG. 1 and FIG. 2, herein, where the scan out chain of bits from the final flip-flop in the predefined series is different from the identical bits of the bit string. Comparing the scan out chain to an expected response data stored in memory in which there is a match indicates a reset of the integrated circuit. This can allow for resetting the plurality of flip-flops associated with an apparatus, or circuits, such as an ASIC among other apparatus discussed herein, to reduce an amount of power consumed by such apparatus or circuits.

Figure 4:
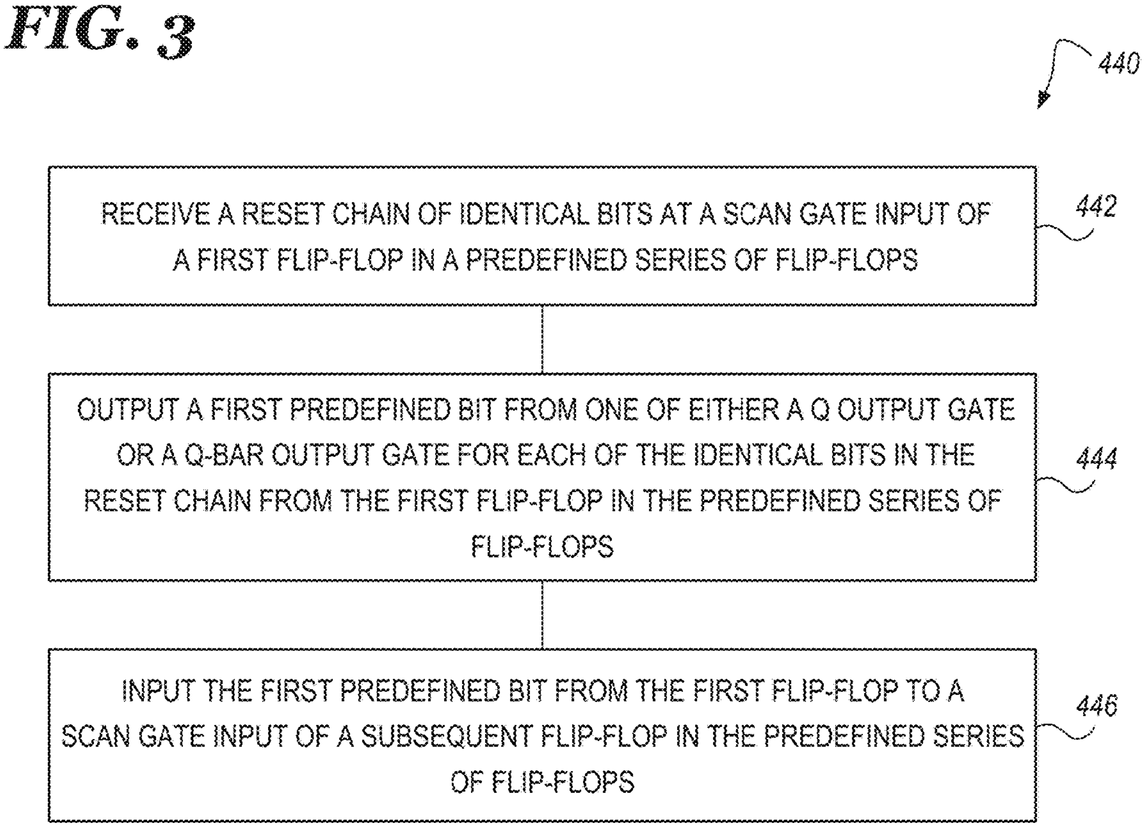
FIG. 4 is another flow diagram corresponding to a method for resetting integrated circuits in accordance with some embodiments of the present disclosure.

FIG. 4 is a flow diagram corresponding to a method 440 for resetting integrated circuits in accordance with some embodiments of the present disclosure. For example, the method 440 can be a method 440 for resetting the plurality of flip-flops to reduce an amount of power consumed in performing a reset operation in accordance with some embodiments of the present disclosure. The method 440 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 440 is performed by one or more components of the apparatus 100 of FIG. 1 and/or the apparatus 200 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 442, a bit string of identical bits is received at a scan gate input of a first flip-flop in a predefined series of flip-flops as described in connection with FIG. 1. The bit string of identical bits can be a bit string of all zeros. Alternatively, bit string of identical bits can be a bit string of all ones. Embodiments are not so limited, however, and in some embodiments, the bit string may not include all identical bits. To facilitate operation 442, the bit string comprising the identical bits is fed through the scan input gate of the first flip-flop of the plurality of flip-flops to facilitate the reset the plurality of flip-flops. As provided herein, resetting the plurality of flip-flops is done in the absence of signaling indicative of performance of a reset operation, as the apparatus lacks any reset circuitry as in connection with FIG. 1. As a result, reset input gates and/or set input gates in the plurality of flip-flops can be eliminated.

At operation 444, a first predefined bit from one of either the Q output gate or the Q-bar output gate for each of the identical bits in the bit string is output from the first flip-flop in the predefined series of flip-flops, as described in connection with FIG. 1. At operation 446, the first predefined bit from the first flip-flop is input to a scan gate input of a subsequent flip-flop in the predefined series of flip-flops. For example, a second predefined bit is output from one of either the Q output gate or the Q-bar output gate for each of the first predefined bit from the first flip-flop. As discussed in connection with FIG. 1, the first predefined bit will be identical to the second predefined bit with the flip-flops are configured in a first series of flip-flops and will be different when the flip-flops are configured in a second series of flip-flops. The second predefined bit from the first subsequent flip-flop is input to the scan gate input of the second subsequent flip-flop in the predefined series of flip-flops. This general pattern of output followed by input in the predefined series of flip-flops is repeated, concluding at the final flip-flop of the predefined series of flip-flops. The scan out chain of bits produced from the final flip-flop in the predefined series, as discussed in connection with FIG. 1, will be different than the identical bits of the bit string.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:

a plurality of flip-flops electrically connected in a predefined series, the plurality of flip-flops comprising:

a first flip-flop configured to receive a bit string of identical bits, wherein a first predefined bit is output from the first flip-flop and input to a second flip-flop in the predefined series; and a final flip-flop configured to produce a scan out chain of bits from either a first output or a second output of the final flip-flop, wherein the scan out chain of bits is different than the identical bits of the bit string.

2. The apparatus of claim 1, wherein:

the plurality of flip-flops further comprises a first series of flip-flops including the first flip-flop; and a first output of each flip-flop of the first series of flip-flops is electrically connected to a scan input of an adjacent flip-flop of the first series.

3. The apparatus of claim 2, wherein:

the plurality of flip-flops further comprises a second series of flip-flops including the final flip-flop; and a first output of one flip-flop of the second series is electrically connected to a scan input of an adjacent flip-flop of the second series.

4. The apparatus of claim 3, wherein a second output of at least one flip-flop of the second series is electrically connected to a scan input of an adjacent flip-flop of the second series.

5. The apparatus of claim 1, wherein the first predefined bit is input from the first flip-flop to a scan input of the second flip-flop.

6. The apparatus of claim 1, wherein the first output of the final flip-flop is a Q output, while the second output of the final flip-flop is a Q-bar output.

7. The apparatus of claim 6, wherein:

the second flip-flop is configured to provide a second predefined bit for each of the first predefined bit to a third flip-flop, wherein the first predefined bit is identical to the second predefined bit.

8. A method, comprising:

electrically connecting a plurality of flip-flops in a predefined series by:

electrically connecting in series each flip-flop of a portion of the plurality of flip-flops to an adjacent flip-flop of the portion of the plurality of flip-flops between a first output of each flip-flop of the portion and a scan input of the adjacent flip-flop of the portion; and electrically connecting in series each flip-flop of another portion of the plurality of flip-flops to an adjacent flip-flop of the another portion of the plurality of flip-flops between a second output of each flip-flop of the another portion and a scan input of the adjacent flip-flop of the another portion; and feeding a bit string through the scan input of a first flip-flop of the plurality of flip-flops to reset the plurality of flip-flops.

9. The method of claim 8, further comprising producing a scan out chain of bits from a final flip-flop of the plurality of flip-flops in the predefined series, wherein the scan out chain of bits is different from the bits of the bit string.

10. An apparatus, comprising:

a plurality of flip-flops electrically connected in a predefined series, wherein a first output of one flip-flop of a portion of the plurality of flip-flops is electrically connected to a scan input of an adjacent flip-flop of the portion of the plurality of flip-flops; and circuitry configured to provide a bit string of identical bits to a first flip-flop of the plurality of flip-flops for resetting of the apparatus;

wherein:

the plurality of flip-flops further comprises a first series of flip-flops and the portion of the plurality of flip-flops is a second series of flip-flops; and a second output of each flip-flop of the first series of flip-flops is electrically connected to a scan input of an adjacent flip-flop in the first series.

11. The apparatus of claim 10, wherein a first output of a final flip-flop of the first series is electrically connected to a scan input of a first flip-flop of the second series.

12. The apparatus of claim 10, wherein the circuitry is further configured to feed the bit string of identical bits through the scan input of the first flip-flop of the first series to reset the plurality of flip-flops in the absence of signaling indicative of performance of a reset operation.

13. The apparatus of claim 10, wherein a quantity of flip-flops of the first series is different than a quantity of flip-flops of the second series.

14. The apparatus of claim 10, wherein:

the first flip-flop is configured to output a first predefined bit for each of the identical bits in the bit string, wherein the first predefined bit is further input to a second flip-flop in the predefined series of flip-flops to eliminate receipt of signaling indicative of a reset operation to reset inputs in the plurality of flip-flops.

15. The apparatus of claim 14, wherein:

the second flip-flop is configured to output a second predefined bit for each of the first predefined bit, wherein the second predefined bit is further input to a third flip-flop in the predefined series of flip-flops.

16. The apparatus of claim 15, wherein the first predefined bit is identical to the second predefined bit.

17. The apparatus of claim 10, wherein a quantity of the identical bits is greater than a quantity of flip-flops of the plurality of flip-flops.

* * * * *